United States Patent [19]

Shinko

[11] 4,264,803
[45] Apr. 28, 1981

[54] RESISTANCE-HEATED PYROLYTIC BORON NITRIDE COATED GRAPHITE BOAT FOR METAL VAPORIZATION

[75] Inventor: Julius S. Shinko, Bay Village, Ohio

[73] Assignee: Union Carbide Corporation, New York, N.Y.

[21] Appl. No.: 868,446

[22] Filed: Jan. 10, 1978

[51] Int. Cl.³ .................. H05B 3/12; F27B 21/04; C23C 13/12
[52] U.S. Cl. .................. 219/275; 13/23; 13/25; 118/726; 219/427; 427/50; 427/113; 427/248.1; 428/408; 432/265
[58] Field of Search .......... 219/420–421, 219/426–427, 543, 271–276; 427/49–51, 248 B, 248 E, 113; 118/48, 49, 49.1, 725–727; 266/206–207, 242; 29/611; 106/39.5; 252/432; 13/23, 29; 428/408; 432/264, 265

[56] References Cited

U.S. PATENT DOCUMENTS

| | | | |
|---|---|---|---|
| 2,665,229 | 1/1954 | Schuler et al. | 118/49 X |
| 2,962,538 | 11/1960 | Alexander | 13/25 |
| 3,063,858 | 11/1962 | Steeves | 118/48 |
| 3,152,006 | 10/1964 | Basche | 428/528 |
| 3,372,671 | 3/1968 | Chu | 219/275 |
| 3,430,937 | 3/1969 | Spitzer | 219/275 |
| 3,452,970 | 7/1969 | Mayer et al. | 432/265 |
| 3,541,301 | 11/1970 | Gallet | 219/271 |
| 3,544,486 | 12/1970 | Passmore | 427/50 |
| 3,576,932 | 4/1971 | Biddulph | 264/57 |
| 3,609,829 | 10/1971 | Carrell et al. | 65/302 |
| 3,658,032 | 4/1972 | Kohler et al. | 118/48 |
| 3,724,996 | 4/1973 | Montgomery | 308/132 |
| 3,986,822 | 10/1976 | Lashway | 432/264 |
| 4,058,579 | 11/1977 | Lashway | 264/81 |

FOREIGN PATENT DOCUMENTS

| | | | |
|---|---|---|---|
| 1193765 | 5/1965 | Fed. Rep. of Germany | 219/275 |
| 2503374 | 8/1976 | Fed. Rep. of Germany | 219/275 |
| 420559 | 3/1974 | U.S.S.R. | 219/275 |

*Primary Examiner*—A. Bartis
*Attorney, Agent, or Firm*—J. Hart Evans

[57] ABSTRACT

Resistance-heated vaporization boats for the vacuum vaporization of metals, such as aluminum, chromium, copper or the like, are made by machining a boat cavity in at least one side of a graphite bar. The bar is totally encapsulated over its entire outer surface, including the boat cavity, with a continuous coating of pyrolytic boron nitride (PBN). The PBN coating is removed from areas at both ends of the bar to provide electrical contact zones for connecting the bar to a power source. The sides and ends of the boat cavity have smooth contours without sharp corners and the ends of the cavity have a hemispherical configuration to resist longitudinal expansion of the PBN coating thereby preventing separation of the PBN coating from the surface of the graphite bar. The PBN coating is deposited from a gas at a temperature of 1750° C. to 2300° C. and has a thickness of at least 0.010 inch.

8 Claims, 4 Drawing Figures

RESISTANCE-HEATED PYROLYTIC BORON NITRIDE COATED GRAPHITE BOAT FOR METAL VAPORIZATION

This invention relates to resistance heated vaporization boats for the vacuum vaporization of metals. More particularly, it relates to such boats made of graphite coated with pyrolytic boron nitride.

The coating of various substrates such as metal, glass, plastic and the like is practiced commercially by a vacuum deposition process. A metal such as aluminum, chromium, copper or the like is vaporized in a vacuum and then deposits on the desired substrate. The metal is vaporized by heating it in a "boat" or container which consists of an elongated bar of electrically conductive material with a depression to contain the metal. The boat is connected in an electric circuit and heats up when current is passed through it. This heat then vaporizes the metal.

The resistance heated vaporization boats in use today are commonly made of intermetallic composite materials such as titanium diboride with boron nitride or titanium diboride with boron nitride and aluminum nitride. These composite materials do last longer than the metal or carbon previously used but have certain disadvantages. The metals contained in the conventional boats become part of the electrical circuit and tend to react with the boat whereby the resistance of the circuit changes. This requires continual adjustment of the power supplied to the circuit containing the boat. Another disadvantage is that the intermetallic composites are marginal performers in the vaporization of aluminum/silicon/copper alloys in the semi conductor industry because of the high purity requirements of the film to be deposited on the silicon wafer for such uses.

We have now found that many of the disadvantages of the prior art can be overcome and a superior vaporization boat can be provided by using high quality graphite coated with pyrolytic boron nitride. The boat has a depression or cavity with hemispherical ends. Pyrolytic boron nitride is deposited by conventional deposition techniques and totally encapsulates the boat except for the ends where the graphite substrate is exposed to provide electrical contact to complete the circuit.

Figure 1:
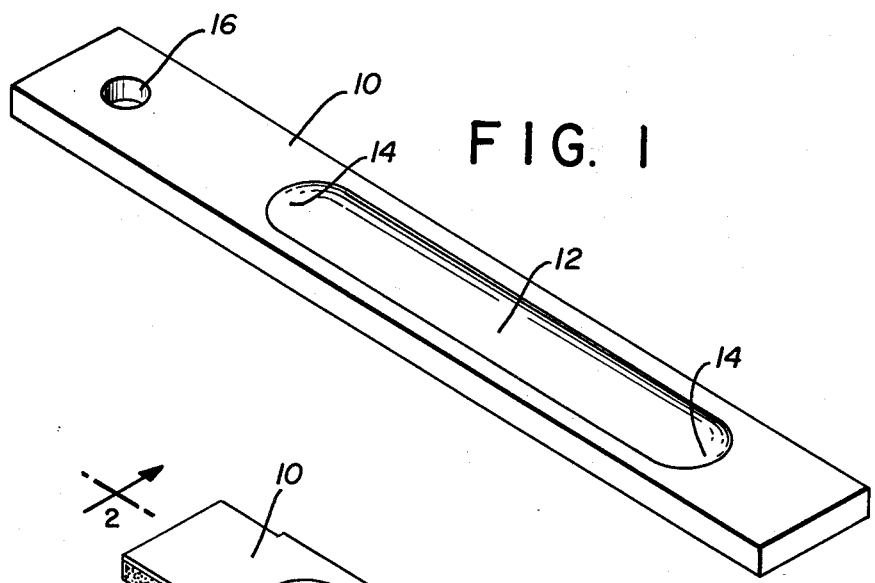
FIG. 1 is an isometric view of a vaporization boat according to the invention immediately after coating with the pyrolytic boron nitride.

In FIG. 1 the pyrolytic boron nitride coating 10 completely covers all the surfaces of the vaporization boat. The depression 12 is formed with hemispherical ends 14. The hole 16 shown in FIG. 1 is where the boat was supported during the coating with pyrolytic boron nitride.

Figure 2:
FIG. 2 is a vaporization boat according to the invention which has been coated with pyrolytic boron nitride and then machined to remove the end coatings and to provide electrical contact.
Figure 3A:
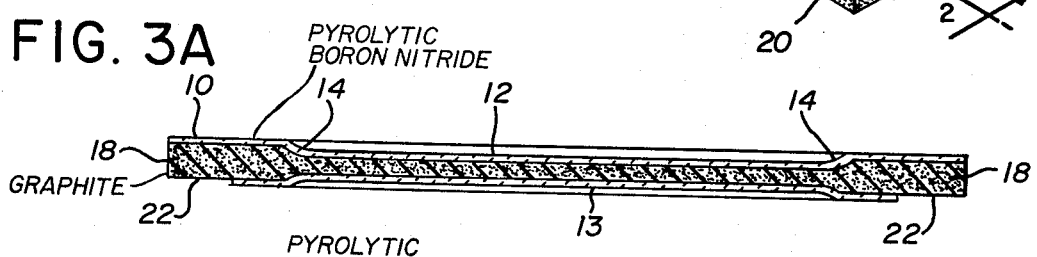
FIG. 3a is a side elevation of a vaporization boat with depressions on both sides.
Figure 3:
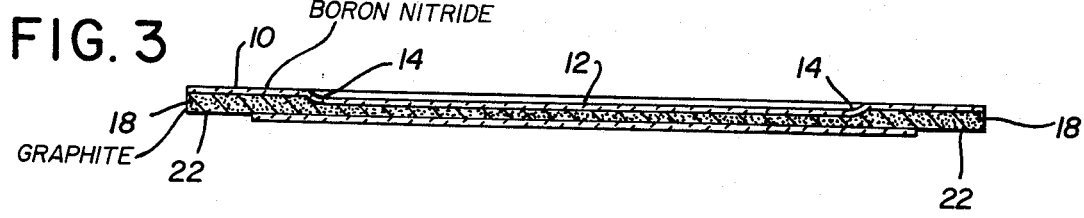
FIG. 3 is a side elevation of the vaporization boat in FIG. 2.

In FIG. 2 a boat is shown after machining to remove pyrolytic boron nitride from the ends. Also as will be seen the extreme end containing the hole 16 has been cut off and removed. On the two ends of the boat 10 as shown in FIG. 2 the pyrolytic boron nitride has been removed from the graphite extreme end edges 18 and from the graphite end sides 20. Also as can be seen in FIG. 3 the pyrolytic boron nitride has been removed from the graphite under surface or bottom surface 22 of the ends. In FIG. 3 the structure of the boat is further illustrated and the manner in which the pyrolytic boron nitride coating has been removed can be seen. In FIG. 3a can be seen a second depression 13 on the opposite side of the first depression 12. The utility of the boat 10 is thus increased as it can be turned over to provide a second depression 13 should the first depression 12 become unservicable from use.

Vaporization boats of the resistance type, such as the boat of the present invention require a precise shape to match the resistance circuit. They are made long and narrow as the length and cross-section determine the electrical resistance of the boat and hence the amount of heat that is generated. Decreasing the thickness of the boat decreases the cross-sectional area and hence increases the heat generated due to the increased resistance. The boat of the present invention is made from a machined block of fine grain high density, high strength graphite. The bar is similar in width and length to conventional intermetallic composite boats. It is however, reduced in thickness compared to conventional boats because of the greater conductivity of graphite. The reduction in cross-sectional area of the boat may be 30 to 40 percent.

The cavity or depression which forms the boat is also different in shape from the cavities in conventional boats. In boats according to the invention it is important that the cavity have smooth contours with no sharp corners. The shape of the ends of the elongated cavity is particularly critical as the cavity ends must aid in restaining the coating in the cavity area. The mismatch in coefficients of thermal expansion for pyrolytic boron nitride and for graphite can be as much as 2:1 in the with grain direction, the pyrolytic boron nitride being lower. In contrast, pyrolytic boron nitride is much higher in the across grain direction, ratios of 7.5:1 are typical. This mismatch means the geometry of the coated part is important in retaining required coating contact to insure good heat transfer. Coating contact and consequently heat transfer may be further improved if the graphite surface is slightly roughened prior to depositing the pyrolytic boron nitride.

In particular the hemispherical ends help contain the coating in the cavity area and in addition do not detract from the vaporization function of the boat. If the cavity is square in cross-section and the ends gently sloped up to the surface, the coating will tend to move up the slope during cool down from deposition temperature, causing loss of contact with the graphite substrate and thereby impairing heat transfer during operation of the boat. Only the geometry of the cavity and nearly total encapsulation of the boat holds the coating on.

Boats are made according to our invention by first machining a bar of graphite to the desired boat width and thickness and a length somewhat longer than the finished boat. The extra length is used to support the bar in a suitable furnace. A cavity of depression is then machined on at least one surface of the bar. If desired, cavities may be cut into both opposite sides. Our preferred method of forming the cavity is to mill it with a ball end mill. The area and depth of the cavity will vary with the intended use but will be the conventional dimensions for such boats. Although the bar can be held in the coating furnace by any convenient means utilizing the extra length, our preferred procedure is to drill a hole at the end of the bar. A support rod can then be inserted into this hole to hold the bar during coating with pyrolytic boron nitride.

The furnace used may be of the resistance heated type. We have constructed a suitable reactor furnace using graphite plates as described in the example below. A number of the boat bars are suspended in the reactor furnace. Vapors of ammonia and a gaseous boron halide, preferably boron trichloride, are passed into the heated furnace reactor. The ratio of ammonia to boron trichloride can vary from about 2 to 1 to about 4 to 1. If desired an inert gas such as nitrogen may be used to increase the flow rates of the gaseous reactants. The reactor is maintained at a temperature of 1750° C. to 2300° C., preferably 1800° C. to 2200° C., with 1875° C. most preferred. A pressure of less than 50 mm of mercury is maintained. The gas flow into the reactor is continued during the reaction period, that is, until the desired coating is achieved. The continuous process employed is that described in U.S. Pat. No. 3,152,006.

The coating of pyrolytic boron nitride achieved by the invention should be at least 0.010 inches in thickness and most preferably at least 0.020 inches. A preferred range is from 0.015 to 0.030 inches. It is important that the pyrolytic boron nitride totally cover or encapsulate the bar, except for the support area which is cut off after coating. The coated boat is allowed to cool and after the support end is cut off the pyrolytic boron nitride is machined away from the ends, sides and bottom of the bar at each end. This provides an exposed area of graphite for electrical contact. The ends can be machined in anyway desired to accommodate clamping devices. It is important that the pyrolytic boron nitride cover the entire surfaces of the boat except for those portions engaged by and hence covered by the electrical clamps.

While the invention has been described with respect to a vaporization boat made from a rectangular bar, the graphite can be machined to any desired shape before coating. Any desired configuration of the cavity or depression can be cut into it, although sharp corners and gentle non-confining slopes should be avoided as discussed above.

The pyrolytic boron nitride coating conducts heat from the graphite bar to the metal in the cavity effectively but since pyrolytic boron nitride has low emissivity compared to the intermetallic composites now used for boats it radiates less energy. The metal vaporized in the boats is electrically isolated from the circuit and chemically isolated from the graphite resistor. Thus, the resistance of the boat/metal system is that of the graphite alone and since the graphite is chemically isolated from the metal, its resistance does not change, so that minimal power adjustments are required during operation. The thermal conductivity of pyrolytic boron nitride is very high along the length of the graphite bar which insure a uniform temperature and more uniform vaporization. The high purity of pyrolytic boron nitride (less than 10 ppm impurities) contributes to high purity in the deposited materials. The high resistance of pyrolytic boron nitride to attack by aluminum and other metals is also important in prolonging the life of the boats.

The example below is illustrative of the example but does not limit it to less than what is claimed.

EXAMPLE

A quantity of fine grain high density high strength graphite was machined into pieces 11 inches long by 1 inch wide by 0.360 inches thick. In each a cavity was formed using a ⅜ inch diameter ball end mill. This cavity was 0.257 inches deep and 8 inches long. At one end of each thus formed "boat" a ¼ inch diameter hole was drilled.

Five pieces of graphite plate each 7½ inches wide by 22 inches high by ½ inch thick were formed into a pentagon shape on top of a graphite plate with a hole in the center for the admission of gas. A second graphite plate was placed above the pentagon shaped grouping of graphite plates and this top plate was raised above pentagon a sufficient height to provide 65.6 sq. inches of exhaust area for gases coming up through the hole in the bottom plate. Holes were drilled on the inside surfaces of the graphite plates and ¼ inch diameter rods were inserted in the holes and used to suspend 15 of the boats.

The entire assembly of graphite plates with the boats suspended inside was loaded into a high temperature resistance heated vacuum furnace capable of maintaining temperatures in excess of 2000° C. and a vacuum of approximately 0.2 torr. The furnace was evacuated to a vacuum of 0.350 torr and then heated to a temperature of 1875° C. A gas mixture was introduced in the quantities of 1.48 liters per minute of boron trichloride, 3.6 liters per minute of ammonia, and 1.24 liters per minute of nitrogen. The gas introduction and subsequent coating was continued for 15 hours. The furnace was then shut down and permitted to cool and after cooling the boats were unloaded.

Upon examination after cooling the boats were found to have a coating of pyrolytic boron nitride varying from 0.015 to 0.030 inches in thickness. The end of each boat containing the hole was then cut off and the boats were machined on the ends to remove the pyrolytic boron nitride coating from the last ¾ inch of all surfaces of each end of each bar, except for the top surface containing the milled depression where the coating was not removed.

What is claimed is:

1. An improved metal vaporization boat comprising a graphite bar having a depression on at least one side of said bar, said bar being covered on its entire outer surface, including said depression, with a continuous coating of pyrolytic boron nitride, except for areas at both ends of said bar which are devoid of said pyrolytic boron nitride coating to provide for electrical contact with the graphite of said bar, the sides and ends of said depression having smooth contours without sharp corners and said ends having a hemispherical configuration to resist longitudinal expansion of said pyrolytic boron nitride coating.

2. A vaporization boat according to claim 1 wherein the coating of pyrolytic boron nitride is at least 0.010 inch in thickness.

3. A vaporization boat according to claim 1 wherein the coating of pyrolytic boron nitride is from 0.015 to 0.030 inches in thickness.

4. A vaporization boat according to claim 1 wherein the coating of pyrolytic boron nitride is at least 0.020 inch in thickness.

5. A vaporization boat according to claim 1 wherein the piece of graphite has depressions on two opposite sides.

6. A vaporization boat according to claim 1 wherein the coating of pyrolytic boron nitride has been deposited from a gas at a temperature of 1750° C. to 2300° C.

7. A piece of graphite having at least one depression on its surface and being covered over substantially all of the outer surface of said graphite piece, including said depression, with a continuous layer of pyrolytic boron nitride, the sides and ends of said depression having smooth contours without sharp corners and said ends having a hemispherical configuration to resist expansion of said pyrolytic boron nitride coating.

8. A piece of graphite according to claim 7 wherein the continuous layer of pyrolytic boron nitride has been deposited from a gas at a temperature of 1750° C. to 2300° C.

* * * * *